United States Patent
Onda

(10) Patent No.: US 7,960,777 B2
(45) Date of Patent: Jun. 14, 2011

(54) MULTI-VALUED MASK ROM

(75) Inventor: Takayuki Onda, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 27 days.

(21) Appl. No.: 12/285,363

(22) Filed: Oct. 2, 2008

(65) Prior Publication Data

US 2009/0090957 A1 Apr. 9, 2009

(30) Foreign Application Priority Data

Oct. 4, 2007 (JP) ................................. 2007-261228

(51) Int. Cl.
*H01L 29/788* (2006.01)

(52) U.S. Cl. ......... 257/316; 257/E21.004; 257/E27.016; 257/E29.3; 365/185.14; 365/154

(58) Field of Classification Search .................. 257/396, 257/314–316, E21.004, E21.683, E27.016, 257/E27.081, E27.11, E27.698, E29.146, 257/E21.679, E29.3; 365/185.14, 154

See application file for complete search history.

(56) References Cited

U.S. PATENT DOCUMENTS

2006/0054953 A1 * 3/2006 Son et al. ...................... 257/296

FOREIGN PATENT DOCUMENTS

| JP | 9-232449 | 9/1997 |
| JP | 10-22481 | 1/1998 |

* cited by examiner

*Primary Examiner* — Victor Mandala
*Assistant Examiner* — Whitney Moore
(74) *Attorney, Agent, or Firm* — McGinn IP Law, PLLC

(57) ABSTRACT

A mask ROM is provided with a plurality of memory cells each including first and second nodes, and a transistor having a source and drain connected to the first and second nodes, respectively. A first memory cell out of the plurality of memory cells further includes a first resistive interconnection which provides an electrical connection between the first and second nodes. The resistance of the first resistive interconnection is adjusted depending on data stored onto the first memory cell.

13 Claims, 24 Drawing Sheets

Fig. 4
| SELECTED CELL | RESISTANCE | CURRENT |
|---|---|---|
| 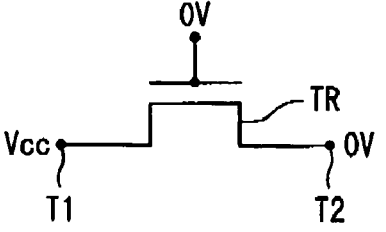 | R0 | I0 (~0) |
| 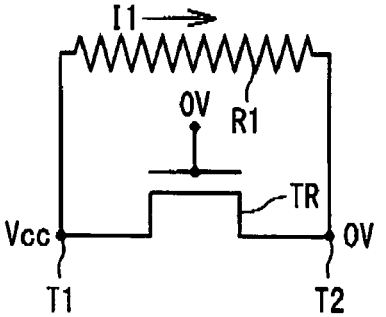 | R1 | I1 |
| 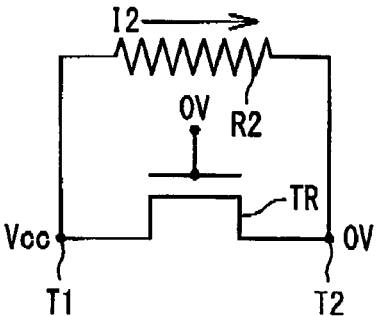 | R2 | I2 |
| 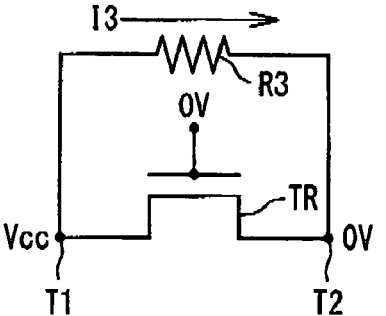 | R3 | I3 |
| R0 > R1 > R2 > R3<br>I0 < I1 < I2 < I3 | | |

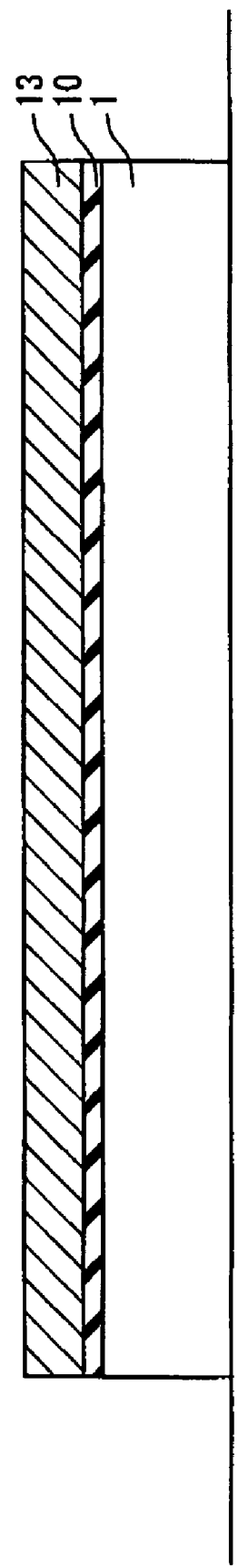

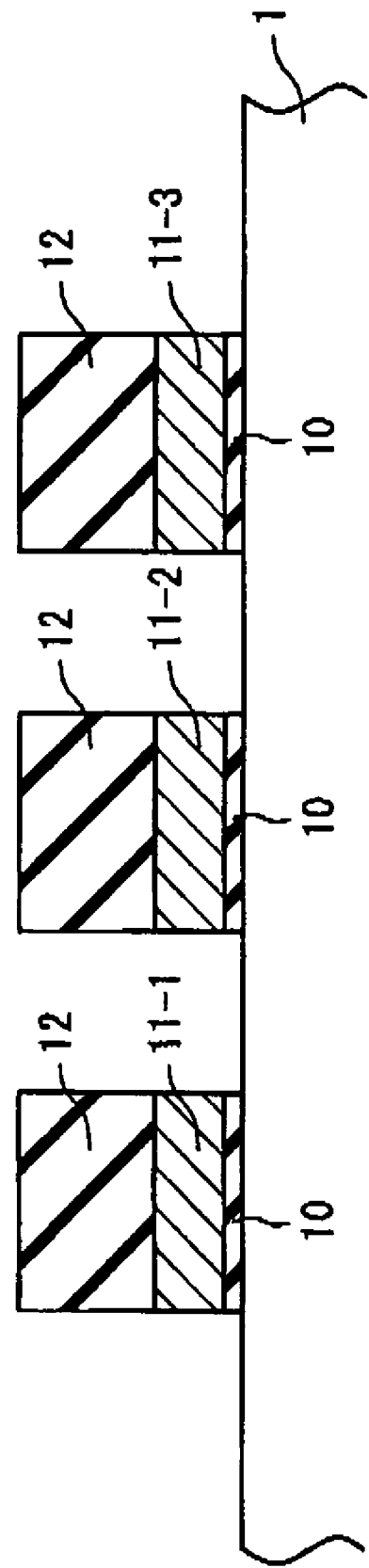

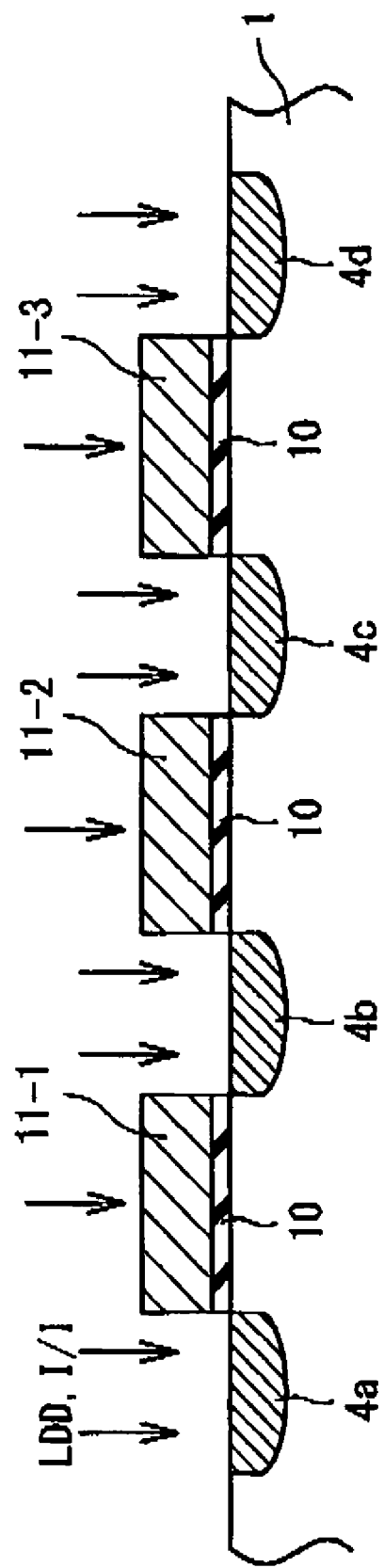

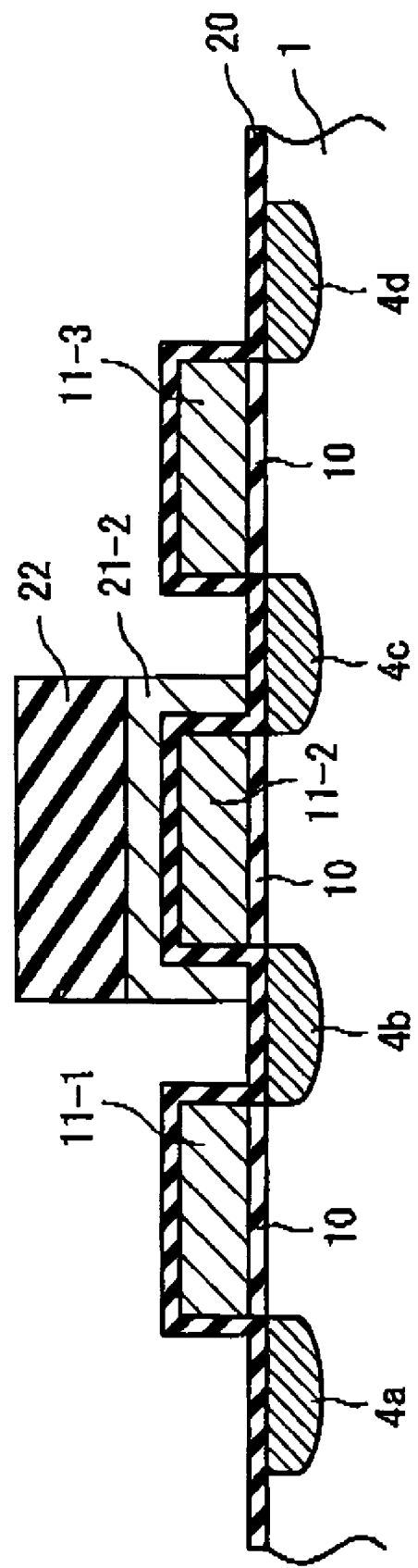

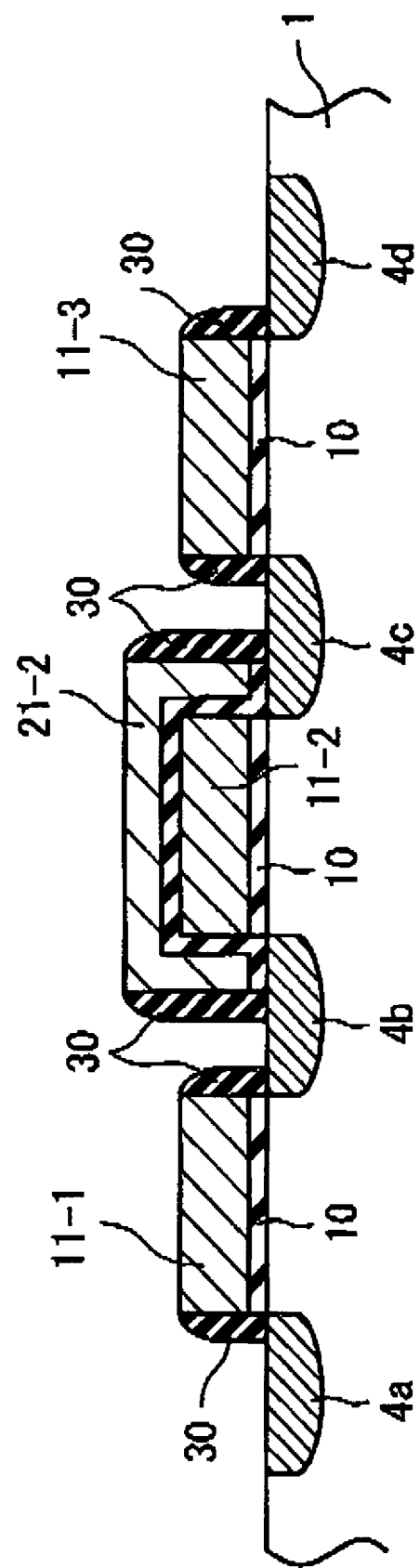

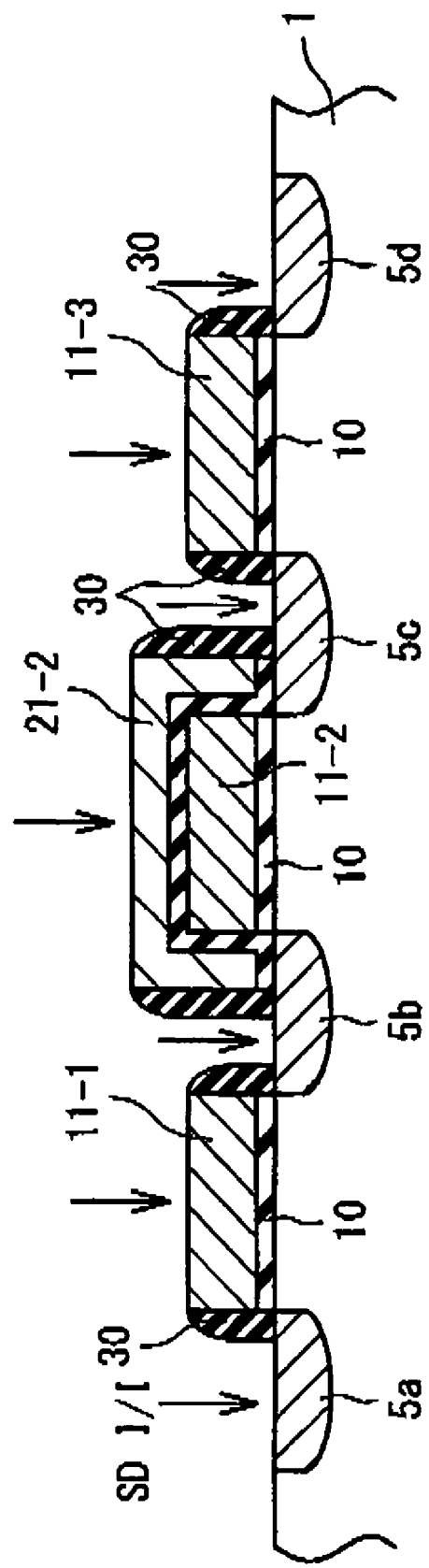

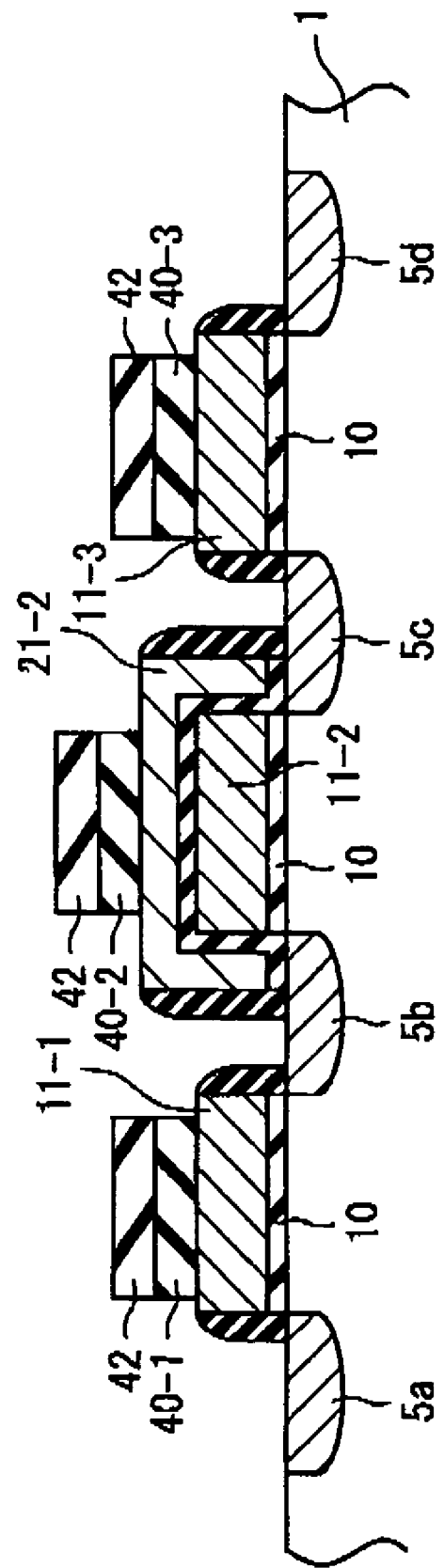

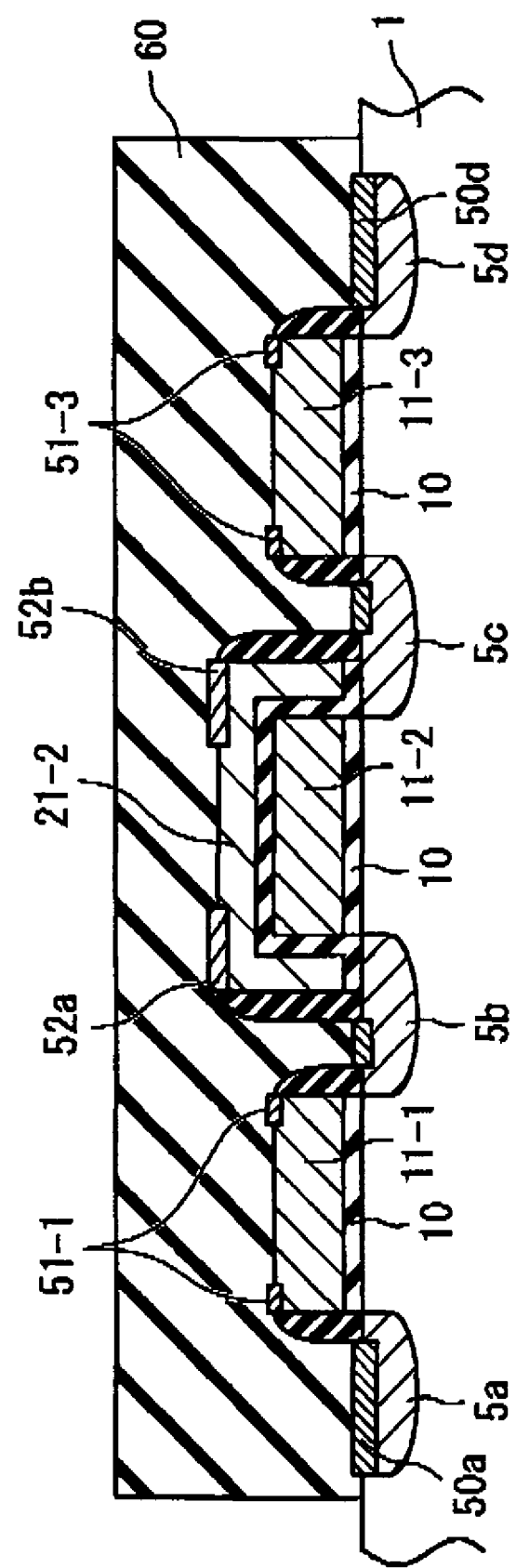

MULTI-VALUED MASK ROM

INCORPORATION BY REFERENCE

This application claims the benefit of priority based on Japanese Patent Application No. 2007-261228, filed on Oct. 4, 2007, the disclosure of which is incorporated herein by reference.

BACKGROUND OF THE INVENTION

1. Field of the Invention

The present invention relates to a mask ROM (read only memory), more particularly, to a mask ROM for storing multi-valued data in each memory cell.

2. Description of the Related Art

As known in the art, the mask ROM is one of commonly used non-volatile memory devices. Differently from an EEPROM (Electrically Erasable Programmable ROM), data store on the mask ROM are not rewritable; data are programmed onto a mask ROM in the manufacture process.

Japanese Laid-Open Patent Application No. JP-A-Heisei, 10-22481 discloses a mask ROM in which data are stored as connections of aluminum interconnections integrated within memory cells. More specifically, each memory cell includes a MOS transistor integrated within a semiconductor substrate. Contact holes reaching the source and drain of the MOS transistor are formed through an interlayer dielectric film covering the MOS transistor, and the contact holes are filled with metal electrodes which reach the top surface of the interlayer dielectric film. In some memory cells, adjoining metal electrodes are connected to each other through an aluminum interconnection integrated within an interconnection layer on the interlayer dielectric film to provide a permanent electrical connection between the source and drain. A memory cell which includes such aluminum interconnection is defined as storing one of data "0" and "1", and another memory cell which does not include such aluminum interconnection is defined as storing the other of data "0" and "1".

One requirement for the mask ROM is reduction of the layout area (or the memory size). One approach for satisfying this requirement is to store three-value or more-value data (that is, multi-value data) onto each memory cell. Such mask ROM able to store multi-value data in each memory cell is referred to as "multi-valued mask ROM", hereinafter.

Japanese Laid-Open Patent Application No. JP-A-Heisei, 9-232449 (the '440 application, hereinafter) discloses a multi-valued mask ROM in which memory cell transistors are arranged in rows and columns. To store four-value data (or two-bit data) in each memory cell transistor, the threshold voltage of the memory cell transistor is set to one of four allowed threshold voltage depending on data to be programmed. The adjustment of the threshold voltage is achieved by controlling the impurity concentration in the channel region of each memory cell transistor. That is, the impurity concentration in the channel region is selected from four different impurity concentrations depending on the data to be programmed. The impurity concentration control provides desired one of the four different threshold voltages for each memory cell transistor to allow programming four-value data.

In the technique disclosed in the '440 application, the impurity implantation into the channel region is achieved as follows. After memory cell transistors are integrated within a semiconductor substrate, ion implantation is repeatedly performed the same number of times as the number of allowed values of the program data. A resist mask is formed to cover the semiconductor substrate and the memory cell transistors in the programming of certain data. The resist mask is provided with openings which only expose memory cell transistors to be programmed. The ion implantation is performed with a dose amount in accordance with the program data by using the resist mask. After that, the resist mask is removed and a new resist mask for programming next data is formed. The ion implantation is performed with a different dose amount by using the new resist mask. The same processing will be repeated the same number of times as the number of allowed values of the program data. It should be noted that thick resist masks are used in the ion implantation, since high energy ions are implanted into the channel regions of the memory cell transistors.

Although the multi-valued mask ROM is advantageous for reduction of the layout area, the technique disclosed in the '449 application undesirably requires repeatedly performing the formation of the resist masks and the ion implantation into the channel regions the same number of times as the number of allowed values of the program data. This leads to an undesirable increase in the TAT (turn-around time) and manufacture cost. In addition, when data of the same value are programmed onto two adjoining memory cell transistors, two openings are formed through the thick resist mask across a narrow spacing. This may result in collapse of the portion of the thick film resist mask between the two openings. To prevent the resist mask from collapsing, it is required to provide a sufficient spacing between the adjoining memory cell transistors. This undesirably leads to the increase in the layout area.

SUMMARY

In an aspect of the present invention, a mask ROM includes a plurality of memory cells. Each of the memory cells includes first and second nodes and a transistor having a source and drain connected to the first and second nodes, respectively. A first memory cell out of the memory cells further includes a resistive interconnection which provides an electrical connection between the first and second nodes. The resistance of the resistive interconnection is adjusted depending on data programmed onto the first memory cell.

In reading data from a selected memory cell out of the memory cells, the transistor within the selected memory cell is turned off. At this moment, the current flowing between the first and second nodes through the selected memory cell depends on the structure of the selected memory cell.

When the selected memory cell does not include the above-described resistive interconnection, substantially no current flows through the selected memory cell. When the selected memory cell includes the above-described resistive interconnection, on the other hand, a read current flows through the resistive interconnection. The current level of the read current depends on the data stored in the selected memory cell, since the resistance of the resistive interconnection is adjusted depending on the stored data. For example, when certain data are programmed in one memory cell, the resistive interconnection of the memory cell is designed to have a relatively large resistance to reduce the read current to a relatively small level. When different data are programmed in another memory cell, the resistive interconnection of the other memory cell is designed to have a relatively small resistance to increase the read current to a relatively large level.

As thus described, at least three states are allowed in the selected memory cell dependent on the structure thereof: (1) a state in which almost no read current flows, (2) a state in which a relatively small read current flows, and (3) a state in which a relatively large read current flows. In other words, each memory cell stores multi-value data, allowing reduction in the layout area of the mask ROM.

As thus described, the present invention effectively reduces the layout area of a mask ROM, and thereby reduces the TAT and manufacture cost.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4 is a conceptual view illustrating a data read operation;

FIGS. 9A to 9M are sectional views showing an exemplary manufacturing process;

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(Memory Device Structure)

Figure 1:
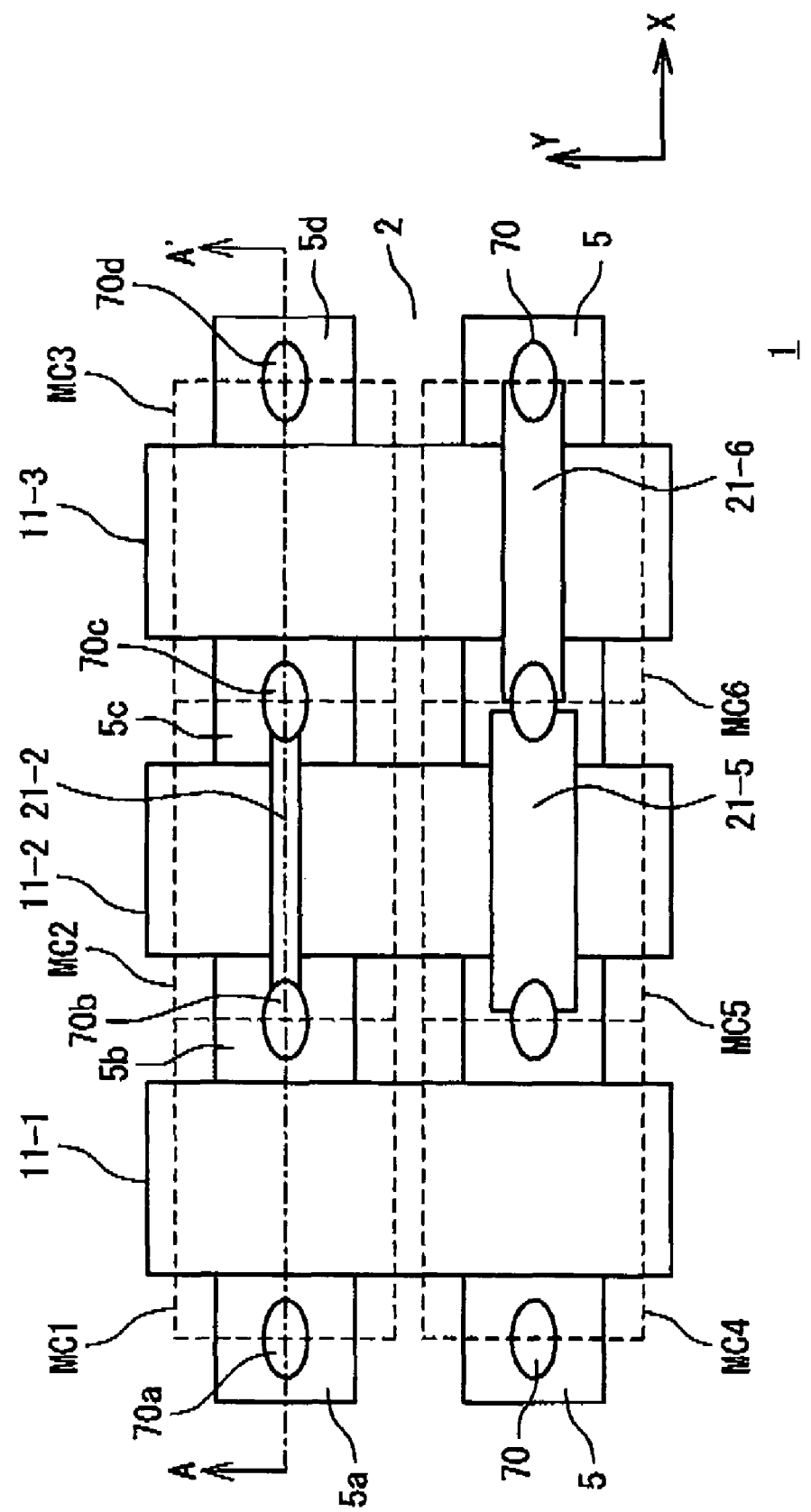
FIG. 1 is a plan view showing an exemplary structure of a mask ROM in one embodiment of the present invention.
Figure 2:
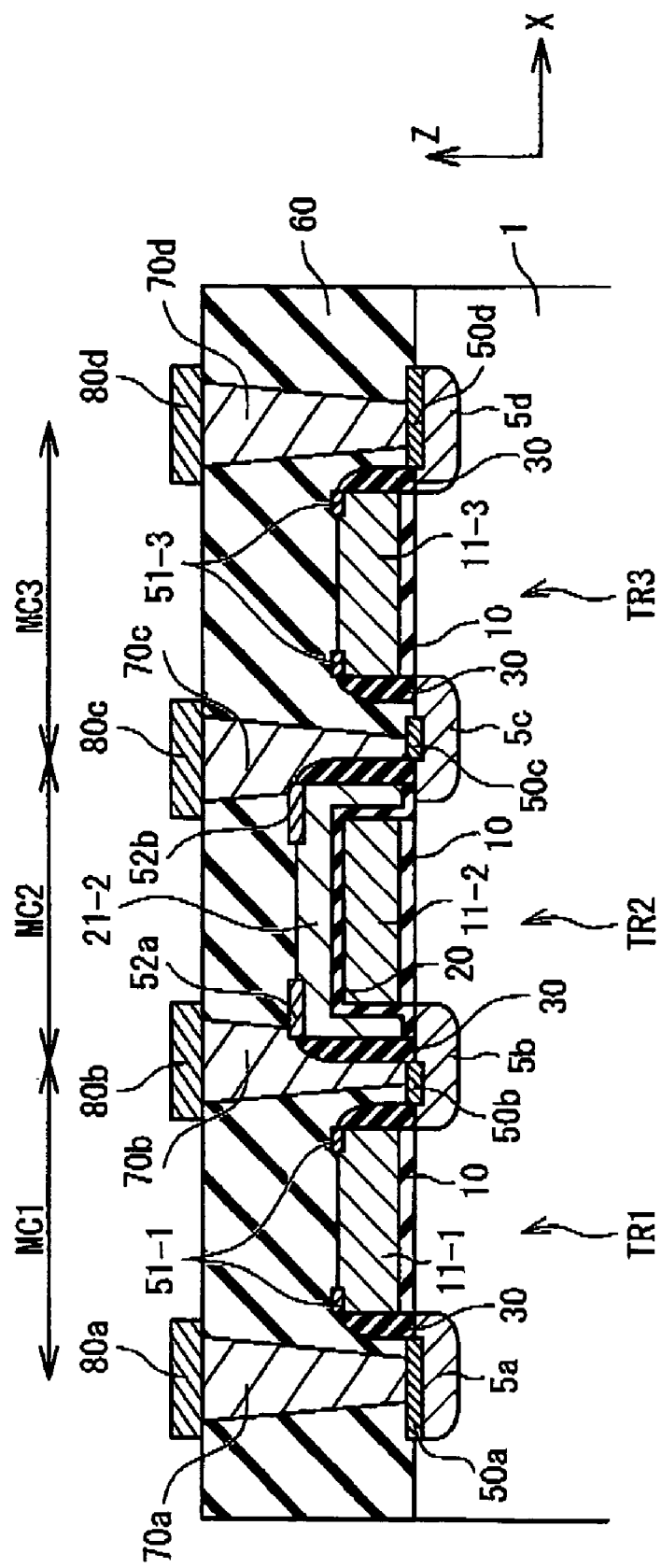
FIG. 2 is a sectional view showing the structure of the mask ROM on an A-A' section in FIG. 1.

FIG. 1 is a plane view showing an exemplary structure of a mask ROM 100 in one embodiment of the present invention, and FIG. 2 is a sectional view showing the structure of the mask ROM 100 on the A-A' section shown in FIG. 1. The mask ROM 100 includes a plurality of memory cells MC arranged in rows and columns; six memory cells MC1 to MC6 are shown in FIG. 1. The memory cells MC1 to MC3 are arranged in a row extending in the X direction while the memory cells MC4 to MC6 are arranged in another row extending in the X direction.

As shown in FIG. 2, the memory cells MC each include a transistor TR formed in the surface portion of a semiconductor substrate 1. In detail, an isolation structure 2 is formed within the semiconductor substrate 1 and the transistors TR are formed in active regions surrounded by the isolation structure 2. The isolation structure 2 may be an STI (Shallow Trench Isolation) structure or a LOCOS (LOCal Oxidation of Silicon) structure, for example. In one embodiment, the semiconductor substrate 1 is a P-type silicon substrate, and the transistor TR is an N-channel MOS transistor. Each transistor TR includes a gate electrode 11 and N-type diffusion regions 5 which are used as a source and drain. As shown in FIG. 1, the gate electrodes 11-1, 11-2, and 11-3 are formed to extend in the Y direction.

More specifically, as shown in FIG. 2, the memory cells MC1 to MC3 include the transistors TR1 to TR3, respectively, which are connected in series. In detail, the transistor TR1 includes diffusion regions 5a and 5b and the gate electrode 11-1. The transistor TR2 includes diffusion regions 5b and 5c and the gate electrode 11-2. The transistor TR3 includes diffusion regions 5c and 5d and the gate electrode 11-3.

Each of the diffusion regions 5a to 5d, which are used as a source or a drain, is formed within the surface portion of the semiconductor substrate 1 and shared by adjacent transistors. In addition, silicide films 50a to 50d are formed on the diffusion regions 5a to 5d, respectively.

The gate electrodes 11-1 to 11-3 are formed to be opposed to the semiconductor substrate 1 across a first gate dielectric film 10. The material of the gate electrodes 11-1 to 11-3 (or the gate material) may be polysilicon, amorphous silicone, silicone germanium, or the like. In one embodiment, the gate material is polysilicon. In addition, side walls 30 are formed on side surfaces of the gate electrodes 11-1 and 11-3. Furthermore, a silicide film 51-1 is formed at least on a portion of the upper surface of the gate electrode 11-1, and a silicide film 51-3 is formed at least on a portion of the upper surface of the gate electrodes 11-3. In another embodiment, silicide films 51-1 and 51-3 may not be formed.

Further, an interlayer dielectric film 60 is formed to cover the semiconductor substrate 1 and the transistors TR. Formed through the interlayer dielectric film 60 are contacts 70a to 70d. The contacts 70a to 70d are electrically connected to the diffusion regions 5a to 5d through the silicide films 50a to 50d, respectively. That is, each of the contacts 70a to 70d is shared by two adjacent transistors. Metal interconnections 80a to 80d are formed in a metal interconnection layer provided on the interlayer dielectric film 60. The metal interconnections 80a to 80d are connected to the contacts 70a to 70d, respectively.

In this embodiment, some of the memory cells MC further include a resistive interconnection 21. In the example of FIG. 2, the memory cell MC2 includes a resistive interconnection 21-2 formed to be opposed to the gate electrode 11-2 across a second gate dielectric film 20. In other words, the memory cell MC2 includes the resistive interconnection 21-2 (the second gate) formed in a second gate layer in addition to the gate electrode 11-2 (the first gate) formed in a first gate layer. The second gate layer is positioned between the first gate layer in which the gate electrode 11 is formed and the metal interconnection layer in which the metal interconnection 80 is formed. That is, the resistive interconnection 21-2 is formed between the first gate layer and the metal interconnection layer, and is integrated within the memory cell MC2 in addition to the gate electrode 11 and the metal interconnection 80.

Material of the resistive interconnection 21 may be the gate material used in the gate process; more specifically, the resistive interconnection 21 may be formed of polysilicon, amorphous silicon, silicon germanium, or the like. In one embodiment, the resistive interconnection 21 may be a polysilicon interconnection. Preferably, the material of the resistive interconnection 21 is same as the material of the gate electrodes 11 of the transistors TR.

As shown in FIG. 2, silicide films 52a and 52b are formed at the edge portions of the upper surface of the resistive interconnection 21-2. The silicide film 52a is in contact with the contact 70b and the silicide film 52b is in contact with the contact 70c. Accordingly, the resistive interconnection 21-2 provides an electrical connection between the contact 70b formed on the diffusion region 5b and the contact 70c formed on the diffusion region 5c. That is, the resistive interconnection 21-2 short-circuits the source and drain of the transistor TR2. It should be noted that the silicide films 52a and 52b may not be formed, and the resistive interconnection 21-2 may be directly in contact with the contacts 70b and 70c.

As shown in FIG. 1, the memory cell MC5 also includes a resistive interconnection 21-5, which has the same function as the resistive interconnection 21-2. The resistive interconnection 21-5 provides an electrical connect between the source and drain of the transistor TR included in the memory cell MC5. In addition, the memory cell MC6 also includes a resistive interconnection 21-6, which has the same function as the resistive interconnection 21-2. The resistive interconnection 21-6 provides an electrical connection between the source and drain of the transistor TR included in the memory cell MC6.

It should be noted that the resistive interconnections 21-2, 21-5, and 21-6 are allowed to have different resistances. In one embodiment, as shown FIG. 1, the widths of the resistive interconnections 21-2, 21-5, and 21-6 in the Y direction may be different from one another.

Figure 3:
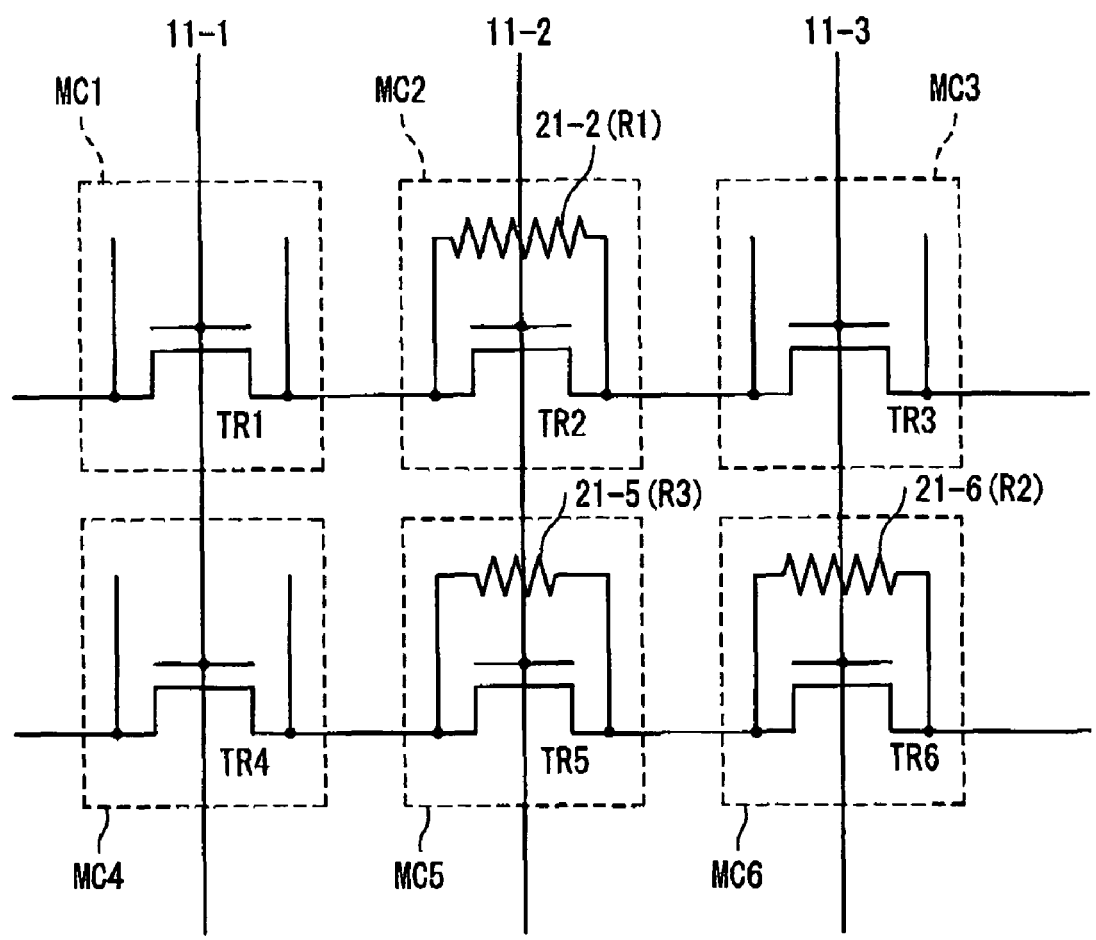
FIG. 3 is a circuit diagram showing an equivalent circuit of the mask ROM shown in FIG. 1.

FIG. 3 is a circuit diagram showing the equivalent circuit of the mask ROM 100 shown in FIG. 1. The memory cells MC1 to MC6 include the transistors TR1 to TR6, respectively. Each transistor TR is connected between the first node of the respective memory cell MC (for example, one of the contacts 70) and the second node (for example, the other one of the contacts 70). In other words, the drain and source of each transistor TR (that is, the diffusion regions 5) are connected to the first node and the second node, respectively. The gate electrode 11-1 is shared by the transistors TR1 and TR4. Correspondingly, the gate electrode 11-2 is shared by the transistors TR2 and TR5, and the gate electrode 11-3 is shared by the transistors TR3 and TR6.

In addition, the memory cell MC2 further includes the resistive interconnection 21-2 which provides an electrical connection between the first node and the second node. Correspondingly, the memory cell MC5 further includes the resistive interconnection 21-5 which provides an electrical connection between the first node and the second node, and the memory cell MC6 further includes the resistive interconnection 21-6 which provides an electrical connection between the first node and the second node. The resistances R1, R3, and R2 of the resistive interconnections 21-2, 21-5, and 21-6 are allowed to be different from one another. In one embodiment, the resistance R1 is largest and the resistance value R3 is smallest (that is, R1>R2>R3).

(Data Programming onto Mask ROM)

In the mask ROM 100 of this embodiment, data are programmed as the difference in the structure of the memory cell MC, more specifically, the difference in the resistance of the memory cell MC, as described above. Data programming and data reading operations will be explained in detail below referring to FIG. 4. In the following, the memory cell MC to be read is referred to as the "selected cell", and the memory cells other than the selected cell are referred to as the "non-selected cells".

As shown in FIG. 4, each transistor TR is connected between the first node T1 and the second node T2. When data stored in the selected cell are read, the transistor TR included in the selected cell is turned-off. In the case where the transistor TR is an N-channel MOS transistor, for example, a gate voltage of 0V is applied to the gate electrode 11 of the transistor TR of the selected cell. In addition, the power supply voltage Vcc is applied to the first node T1 (or the drain of the transistor TR) and the ground voltage is applied to the second node T2 (or the source of the transistor TR). The current through the selected cell at this moment varies depending on the structure of the selected cell.

For the case where the selected cell does not include the resistive interconnection 21 and the drain and source of the transistor TR are not short-circuited, substantially no current flows between the first node T1 and the second node T2, since the transistor TR is turned off. In detail, the resistance R0 of the transistor TR in the off state is extremely large; the resistance R0 typically ranges in the order of several $10 \times 10^{12} \Omega$. The current I0 through the selected cell at this moment is nearly zero.

For the case where the selected cell includes the resistive interconnection 21 and the drain and source of the transistor TR are electrically connected, the transistor TR (the OFF-state transistor) and the resistive interconnection 21 are connected in parallel between the first node and the second node. This causes a current to flow between the first node T1 and the second node T2 through the resistive interconnection 21. Since the resistance value R0 of the OFF transistor is extremely large, the resistance of the selected cell in this case is determined mainly depending on the resistance of the resistive interconnection 21.

When the resistance of the resistive interconnection 21 is R1, the current through the selected cell is I1. Correspondingly, the current through the selected cell is I2 when the resistance of the resistive interconnection 21 is R2, and the current through the selected cell is I3, when the resistance of the resistive interconnection 21 is R3. In this case, it holds:

$$I1<I2<I3,$$

since the following relationship holds:

$$R1>R2>R3.$$

Figure 5:
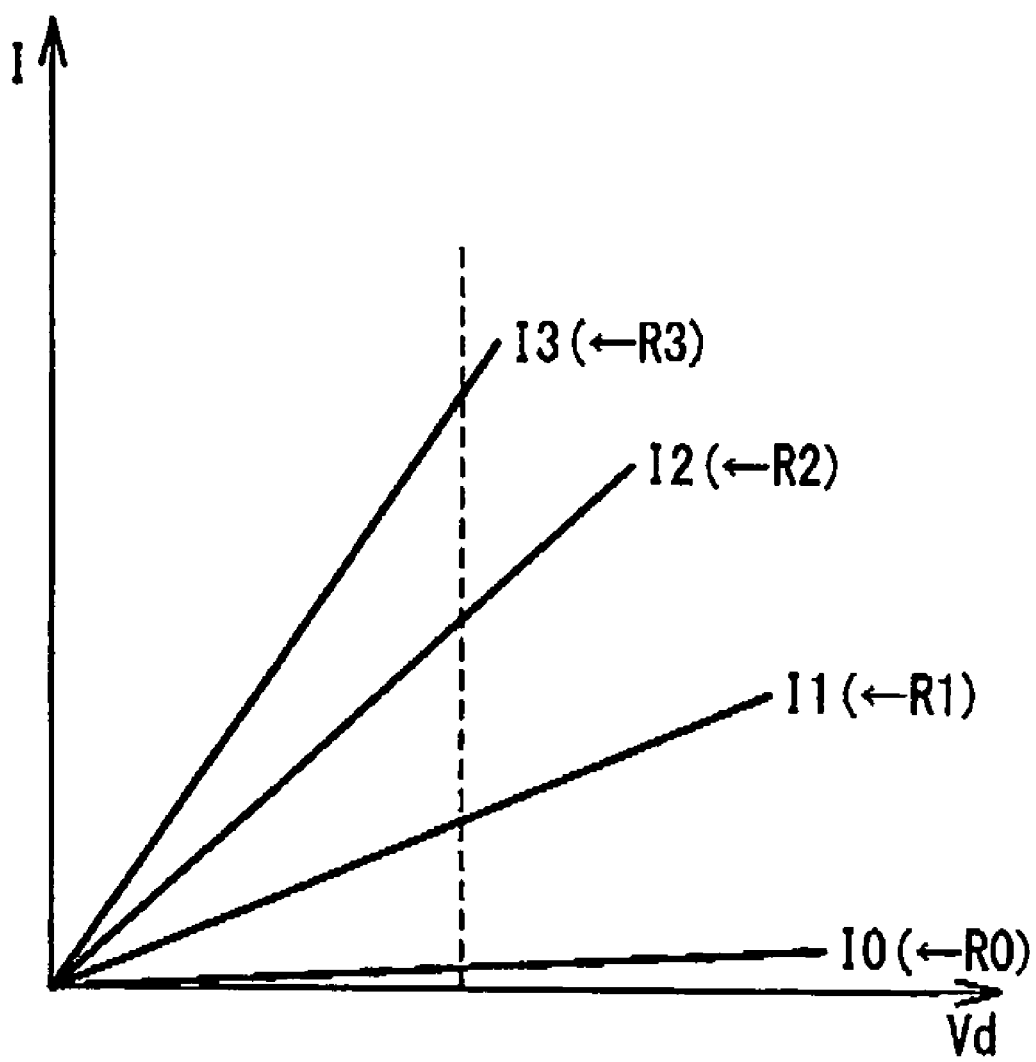
FIG. 5 is a graph for explaining the data reading operation.

FIG. 5 is a graph conceptually showing the relationship of the currents I0 to I3 shown in FIG. 4. The horizontal axis represents the drain voltage Vd applied to the first node T1, and the longitudinal axis represents the current level of the current through the selected cell. As shown in FIG. 5, the currents I0 to I3 with different current levels (I0<I1<I2<I3) are obtained for the respective resistance values R0 to R3 of the selected cells. The currents I0 to I3 of the four different current levels are associated with the allowed four data values, respectively. That is, the storage of four value data (or two-bit data) onto each memory cell MC is realized.

It can be said that the storage of the four value data is realized by the existence or the nonexistence of the resistive interconnection 21 and by the resistance of the resistive interconnection 21, which is selected from the three resistance values R1 to R3. It is especially important that the resistance of the resistive interconnection 21 is selectable from a plurality of different resistances. In other words, the resistance of the resistive interconnection 21 is selected depending on data to be programmed onto the memory cell MC of interest, not limited to one value. This allows the storage of the multi-value data onto each memory cell MC.

The data programming onto each memory cell MC is achieved by the selective integration of the resistive interconnection 21 and the adjustment of the resistance of resistive interconnection 21, depending on data to be programmed. As shown in FIG. 1, for example, the width of the resistive interconnection 21 may be adjusted depending on the data to be programmed. Instead, the impurity concentration of the resistive interconnection 21 may be adjusted depending on the data to be programmed.

The read operation from the selected cell is achieved as shown in FIG. 4. A predetermined voltage is applied between the first node T1 and the second node T2 of the selected cell, and the transistor TR included in the selected cell is turned off. As a result, a read current with one of the current levels I0 to I3 shown in FIG. 5 flows through the selected cell. Data stored in the selected cell are identified by comparing the current level of the read current with predetermined reference levels. The reference levels are set to the value between the current levels I0 and I1, between the current levels I1 and I2, and between the current levels I2 and I3, respectively.

Figure 6:
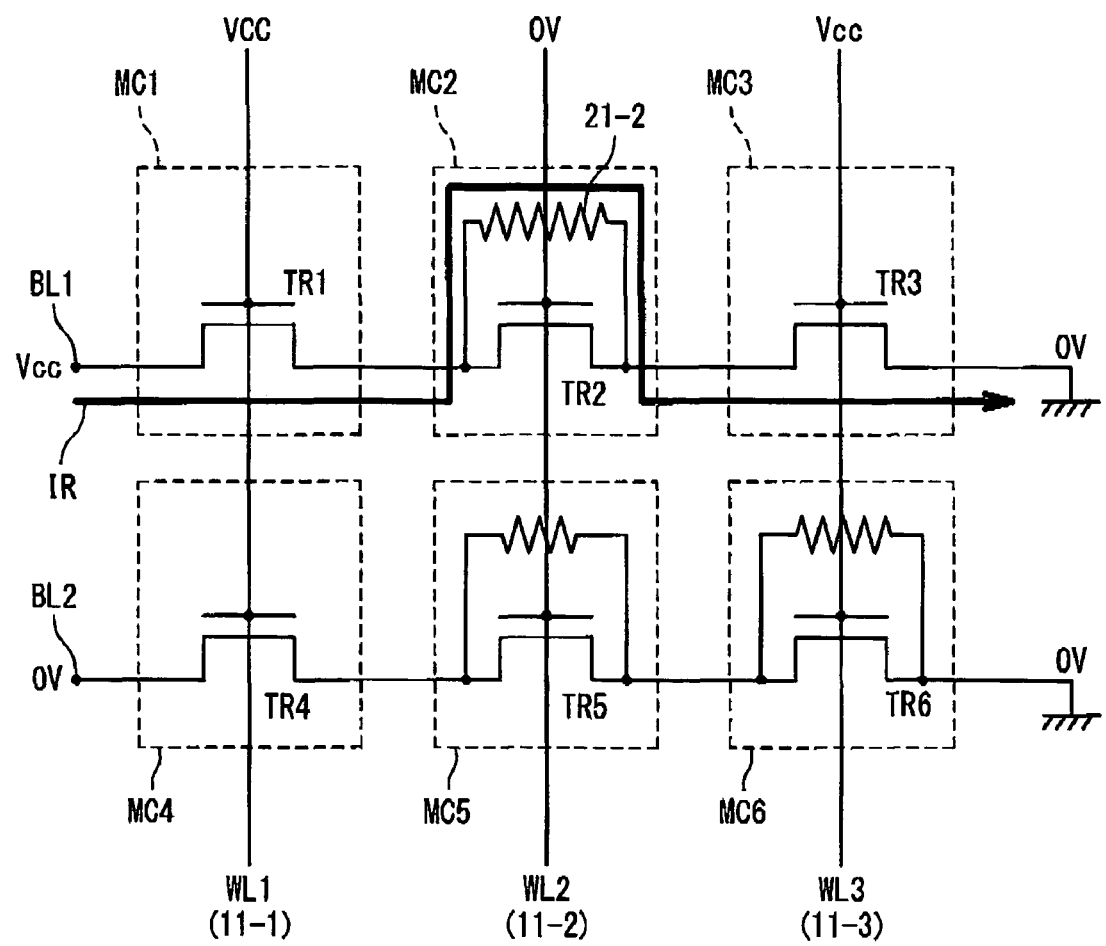
FIG. 6 is a circuit diagram showing one example of the data reading operation.

It should be noted that non-selected cells other than the selected cell may cause considerable influences on the read operations. FIG. 6 shows an exemplary read operation for the circuit configuration shown in FIG. 3. In the example shown in FIGS. 3 and 6, the transistors TR1 to TR3 (or TR4 to TR6) are connected in series. That is, the memory cells MC1 to MC3 (or MC4 to MC6) are arranged to form a "NAND type" ROM.

In detail, one end of the chain of the serially-connected memory cells MC1 to MC3 is connected to a bit line BL1 and the other end is connected to the ground. Correspondingly, one end of the chain of the serially-connected memory cells MC4 to MC6 is connected to a bit line BL2 and the other end is connected to the ground. The memory cells MC1 and MC4 are connected to a word line WL1 (the gate electrode 11-1). Correspondingly, the memory cells MC2 and MC5 are connected to a word line WL2 (the gate electrode 11-2), and the memory cells MC3 and MC6 are connected to a word line WL3 (the gate electrode 11-3).

For the case where the selected cell is the memory cell MC2, for example, the power supply voltage Vcc is applied to the bit line BL1, and a voltage of 0V is applied to the bit line BL2. In addition, a voltage of 0V is applied to the word line WL2, and the power supply voltage Vcc is applied to the word line WL1 and the word line WL3. As a result, the transistor TR2 of the selected cell MC2 is turned off and the transistors TR1 and TR3 of the non-selected cells MC1 and MC3 are turned on. A read current IR flows through the memory cells MC1 to MC3, since the selected cell MC2 includes the resistive interconnection 21-2.

The read current IR depends on the combined resistance of the memory cells MC1 to MC3; the read current IR is not determined only by the resistance of the selected cell MC2. That is, the read current IR depend on the resistances (or the program data) of the non-selected cells MC1 and MC3 connected in series to the selected cell MC2. The change in the combination of the program data of the non-selected cells MC1 and MC3 causes the change in the current level of the read current IR. Accordingly, there is a possibility that a simple relationship shown in FIG. 5 cannot be obtained.

(Influence of Non-Selected Cells in Read Operations)

Figure 7:
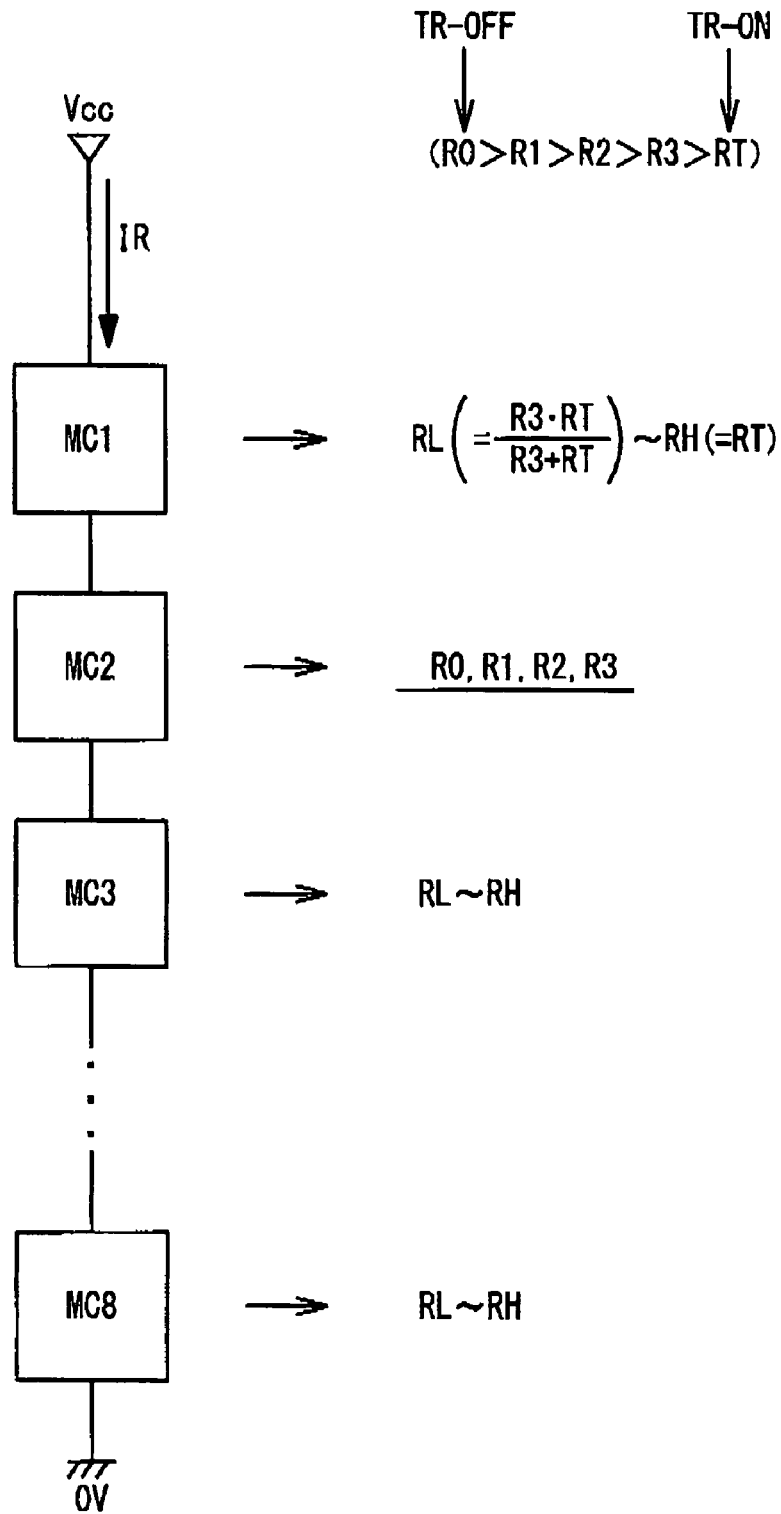
FIG. 7 is a schematic view for explaining an influence of non-selected cells.

In the following, a discussion is given of the influence of non-selected cells in the data read operation for eight memory cells MC1 to MC8 shown in FIG. 7, which are connected in series. When voltages Vcc and 0V are applied to the respective ends of the chain of the memory cells MC1 to MC8, a read current IR flows through the memory cells MC1 to MC8.

In the following, the read operation is described with an assumption that the memory cell MC2 is selected as the selected cell. In this case, the transistor TR of the memory cell MC2 is turned off. Accordingly, the resistance of the memory cell MC2 is set to any of R0, R1, R2, and R3, depending on the programmed data (see FIG. 6).

On the other hand, the respective transistors TR of the remaining seven non-selected cells (MC1 and MC3 to MC8) are turned on. The resistance of the turned-on transistors TR (the ON-state resistance) is "RT". The resistances of the non-selected cells are also varied depending on the data stored therein. The resistance of each non-selected cell takes the maximum value when the non-selected cell only includes the ON-state transistor, excluding the resistive interconnection. The resistance value in that case is identical to the resistance RT of the ON transistor, which is referred to as the "maximum resistance RH (=RT)", hereinafter. On the other hand, when the ON transistor and the resistive interconnection 21 with a minimum resistance value R3 are connected in parallel, the resistance value is minimized. The resistance value in that case is R3·RT/(R3+RT), which is referred to as the "minimum resistance RL", hereinafter.

The combined resistance R' of the memory cells MC1 to MC8 depends on the combination of the data stored in the memory cells MC1 to MC8. Especially, the combined resistance R' varies depending on the combination of data of the non-selected cells, even when the data of the selected cell MC2 are fixed. That is, even when the data of the selected cell MC2 are fixed, the read current IR may vary within a certain range.

Figure 8:
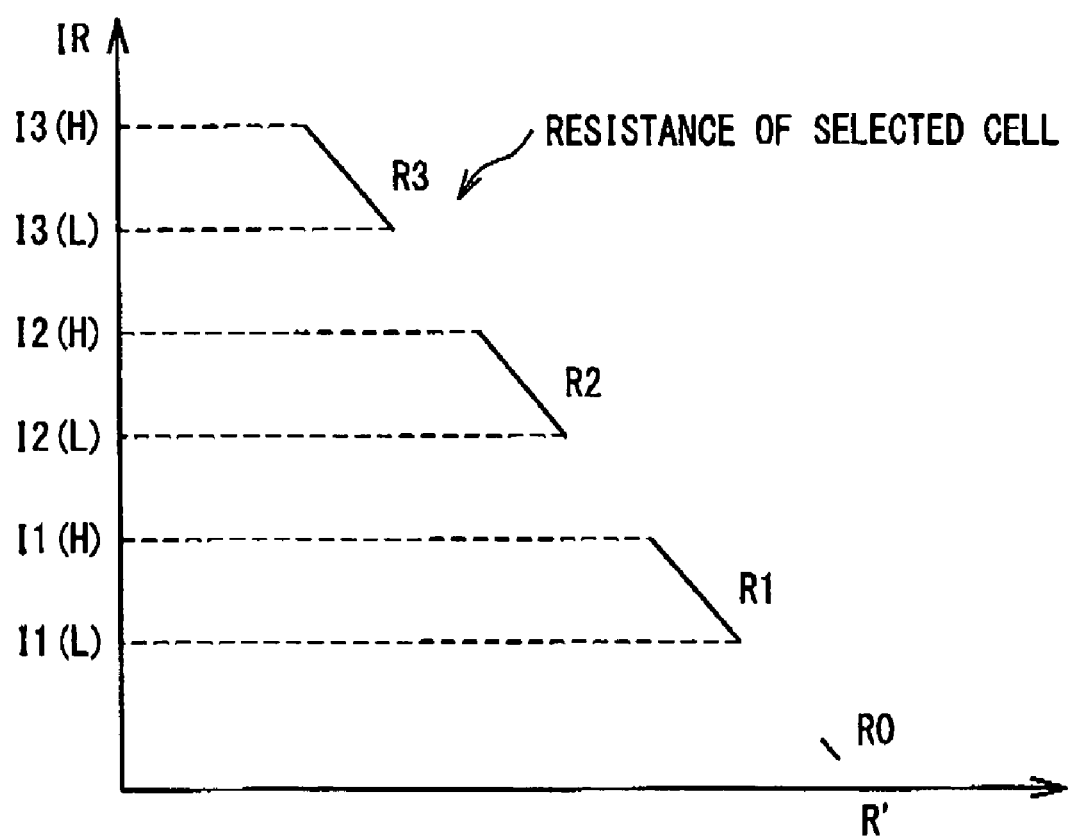
FIG. 8 is a graph chart for explaining the influence of the non-selected cells.

FIG. 8 is a graph conceptually showing the allowed range of the read current IR. In FIG. 8, the longitudinal axis represents the read current IR and the horizontal axis represents the combined resistance R'. The allowed range of the read current IR and the combined resistance R' are indicated by the line segments.

For the case where the resistance of the selected cell MC2 is R3, for example, the combined resistance R' is minimized (R'=R3+7×RL) when all of the resistances of the remaining seven non-selected cells are the minimum resistance RL. On the other hand, the combined resistance R' is maximized (R'=R3+7×RH), when all of the resistance values of the remaining seven non-selected cells are the maximum resistance RH. Accordingly, the read current IR takes the maximum value I3(H) of Vcc/(R3+7×RL), and the minimum value I3(L) of Vcc/(R3+7×RH). That is, the read current IR is allowed to vary within a range from I3(H) to I3(L) when the resistance of the selected cell MC2 is fixed to R3. Correspondingly, the read current IR is allowed to within a range from I2(H) to I2(L), when the resistance value of the selected cell MC2 is fixed to R2, and the reading electric current IR is allowed to vary within a range from I1(H) to I1(L), when the resistance value of the selected cell MC2 is fixed to R1. The maximum values and minimum values are as follows.

$I3(H) = Vcc/(R3+7 \times RL)$, $I3(L) = Vcc/(R3+7 \times RH)$, $I2(H) = Vcc/(R2+7 \times RL)$, $I2(L) = Vcc/(R2+7 \times RH)$, $I1(H) = Vcc/(R1+7 \times RL)$, $I1(L) = Vcc/(R1+7 \times RH)$ To surely identify the data of the selected cell MC2, margins are required between the respective allowed ranges of the read current as shown in FIG. 8; the respective ranges of the read current for different data are required not to overlap. For this purpose, a first condition "I3(L)>I2(H)" and a second condition "I2(L)>I1(H)" are required to be satisfied. It should be noted here that the resistance R0 of the OFF transistor is extremely large, ranging in the order of several $10 \times 10^{12} \Omega$.

Thus, when the resistance of the selected cell MC2 is R0, the current level of the read current IR is substantially zero regardless of the states of the non-selected cells. That is, the read current IR for the case where the resistance of the selected cell MC2 is R0 is sufficiently smaller than I1(L).

When both of the above-described first and second conditions are met, accurate data identification is assured for any combination of the selected cells and the non-selected cells. When the above-mentioned first and second conditions are described by using the equations of "RH=RT" and "RL=R3·RT/(R3+RT)", the following formulas (1) and (2) are obtained, respectively:

$$7RT^2+(R3-R2)RT+R3(R3-R2)<0, \quad (1)$$

$$7RT^2+(R2-R1)RT+R3(R2-R1)<0. \quad (2)$$

In the following, a discussion is given of the case where the resistive interconnection 21 is a polysilicon interconnection, for example. The sheet resistance ρs of the polysilicon is several 10 to several tens of thousands $\Omega/\square$. In the following, the sheet resistance ρs of the resistive interconnection 21 is assumed to be 9000$\Omega/\square$, for example. The resistance of the resistive interconnection 21 is given as ρs×Lp/Wp, where Lp and Wp are the length and width of the resistive interconnection 21, respectively. For example, the length Lp is designed to 0.74 μm, while the width Wp is selected out of three values: 0.02 μm, 0.32 m, and 0.62 μm, depending on the data to be programmed. In this case, the resistance of the resistive interconnection 21 is allowed to be any of 30273$\Omega$ (=R1), 20813$\Omega$ (=R2), and 10742$\Omega$ (=R3). When these resistance values R1 to R3 are used, the following formulas (3) and (4) are obtained, respectively, from the above mentioned formulas (1) and (2):

$$RT<4716\Omega, \text{ and} \quad (3)$$

$$RT<4545\Omega. \quad (4)$$

The formulas (3) and (4) correspond to the first condition and the second condition, respectively. These requirements are easily satisfied by using a usual MOS transistor. For a MOS transistor with a gate length L of 0.24 μm and a gate width W of 6 μm, for example, the ON current Ion of this MOS transistor is typically several mA, when the source-drain voltage Vd is 2.5 V. In this case, the on resistance RT is calculated as approximately 900$\Omega$. The on resistance RT of this MOS transistor apparently meets the requirements of the formulas (3) and (4).

As explained above, the data of the selected cell MC2 can be accurately identified under a situation where the non-selected cells influence on the read current IR. The above discussion quantitatively proves the implementation feasibility of the multi-valued mask ROM of this embodiment.

As a comparative example, a discussion is given in the following of a case where aluminum interconnections are used instead of the resistive interconnections 21. The sheet resistance of an aluminum interconnection is around 0.3$\Omega/\square$; the resistance of an aluminum interconnection is very small. In the same way as the above-described discussion for the polysilicon interconnection, a relationship of "R1, R2, R3<<<RT" is obtained for the case where the resistance values R1 to R3 represent the resistance of the aluminum interconnection. This leads to that the minimum resistance RL (=R3·RT/(R3+RT)) is approximately R3. When the first condition "I3(L)>I2(H)" is rewritten by using the relational formula of "RH=RT" and "RL~R3" for example, the following formula (5) is obtained.

$$RT<(R2+6\times R3)/7. \quad (5)$$

It would be understood that it is extremely difficult to satisfy the formula (5) from the fact that it holds:

$$R1, R2, R3<<RT,$$

as described above. That is, the replacement of the resistive interconnection 21 with an aluminum interconnection results in unsuccessful identification of the data stored in the selected cell MC2. This is because the ratio between the maximum resistance RH (=RT) and minimum resistance RL (to R3) of the non-selected cell is too large. Since the ratio is too large, the variation range of the read current IR is increased. As a result, the ranges of the read current IR shown in FIG. 8 may undesirably overlap one another.

As explained above, the use of the aluminum interconnection undesirably enhances the influence of the non-selected cells, making it extremely difficult to accurately identity the data stored in the selected cell MC2. This implies that it is very difficult to realize multi-valued data when a metal interconnection is used as the resistive interconnection 21. In this embodiment, the multi-valued mask ROM is realized by using a resistive interconnection formed of the gate material.

(Exemplary Manufacture Process)

FIG. 9A to FIG. 9M are sectional views showing an exemplary manufacture process of the mask ROM 100 in this embodiment.

At first, an isolation structure 2 is formed in the surface portion of the semiconductor substrate 1 (for example, a P-type silicon substrate). After the formation of the isolation structure 2, as shown in FIG. 9A, the first gate dielectric film 10 (for example, a silicon oxide film) is formed on the semiconductor substrate 1. Further, a gate material film 13 is formed on the first gate dielectric film 10. The gate material film 13 is a film from which the gate electrodes 11-1 to 11-3 are formed. The gate material film 13 may be a polysilicon film, an amorphous silicon film, a silicon germanium film, or the like.

This is followed by forming a resist mask 12 which covers the region where the gate electrodes 11-1 to 11-3 are to be formed, as shown in FIG. 9B. The gate material film 13 and the first gate dielectric film 10 are selectively etched by using the resist mask 12 to form the gate electrodes 11-1 to 11-3. After that, the resist mask 12 is removed.

As shown in FIG. 9C, the ion implantation for forming lightly-doped drains is then performed. As a result, the LDD regions 4a to 4d are formed within the semiconductor substrate 1.

Figure 9D:
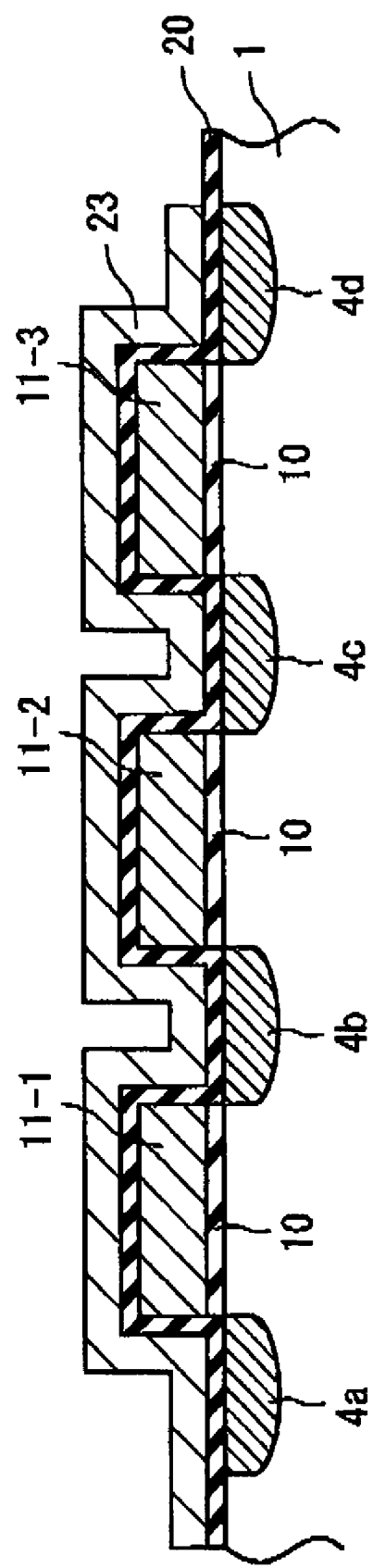

As shown in FIG. 9D, a second gate dielectric film 20 is then deposited to cover the entire structure by a CVD method and the like. Moreover, a resistance material film 23 is then deposited on the entire structure by a CVD method and the like. That is, the resistance material film 23 is formed to cover the gate electrodes 11-1 to 11-3 across the second gate dielectric film 20. The resistance material film 23 is a film from which the resistive interconnections 21-2, 21-5, and 21-6 are formed, and is formed of gate material used in the gate process. For example, the resistance material film 23 may be a polysilicon film, an amorphous silicon film, a silicon germanium film, or the like.

As shown in FIG. 9E, a resist mask 22 is then formed to cover the region where the resistive interconnections 21 are to be formed. By using the resist mask 22, the resistance material film 23 is selectively etched to form the resistive interconnection 21-2 which is opposed to the gate electrode 11-2 across the second gate dielectric film 20.

Figure 10:
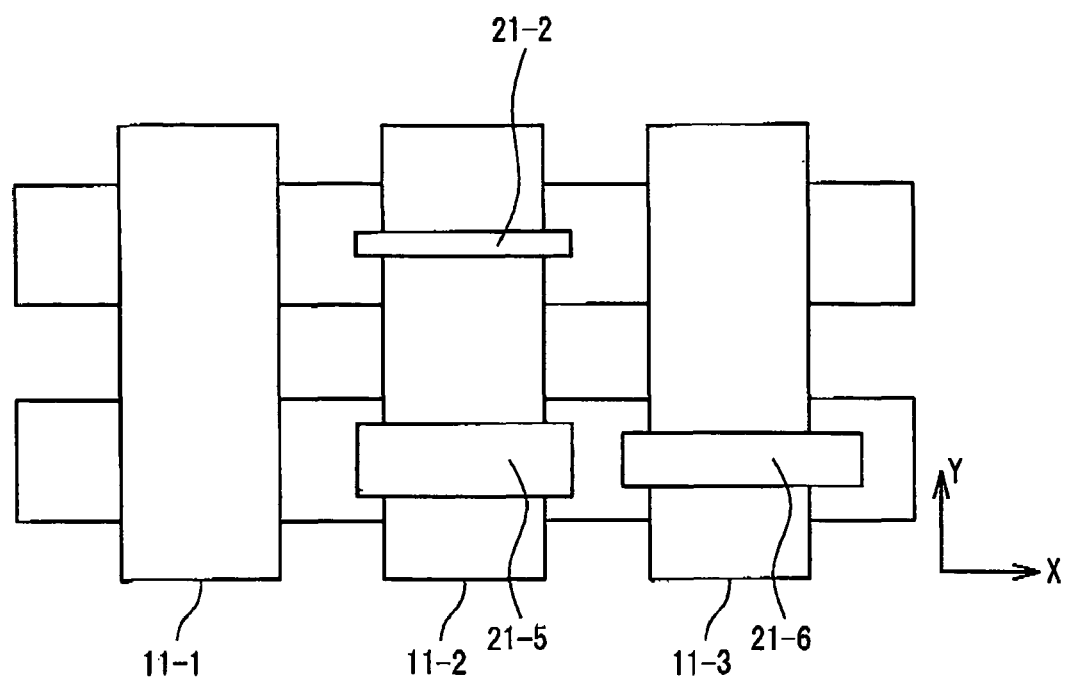
FIG. 10 is a plan view showing the exemplary manufacturing process of FIGS. 9A to 9M.

FIG. 10, which is a plan view corresponding to FIG. 1, shows the plan structure after the process shown in FIG. 9E. As shown in FIG. 10, a plurality of the resistive interconnections 21-2, 21-5, and 21-6 are simultaneously formed. These resistive interconnections 21-2, 21-5, and 21-6 are formed so as to have widths depending on the data to be programmed. That is, the process shown in FIG. 9E is the data programming process onto the mask ROM 100.

In other words, a mask pattern is determined on the basis of the data to be programmed onto the mask ROM 100. After that, the resist mask 22 with such-determined mask pattern is formed. The resistive interconnections 21-2, 21-5 and 21-6 of desired shapes are simultaneously formed by etching the resistance material film 23 using the resist mask 22. The resistances (or the widths) of the formed resistive interconnections 21-2, 21-5 and 21-6 are adjusted depending on the data to be programmed. As described above, data of different values can be programmed only by the single photolithography process for the resistance material film 23.

After that, the resist mask 22 is removed and the exposed portion of the second gate dielectric film 20 is also removed. Subsequently, a dielectric film is deposited and etched back. As a result, as shown in FIG. 9F, side walls 30 are formed on the side surfaces of the gate electrodes 11-1 and 11-3 and the resistive interconnection 21-2.

Next, as shown in FIG. 9G, the ion plantation is performed to form the source and drain of the respective transistors. As a result, the diffusion regions 5a to 5d are formed within the semiconductor substrate 1.

Figure 9H:
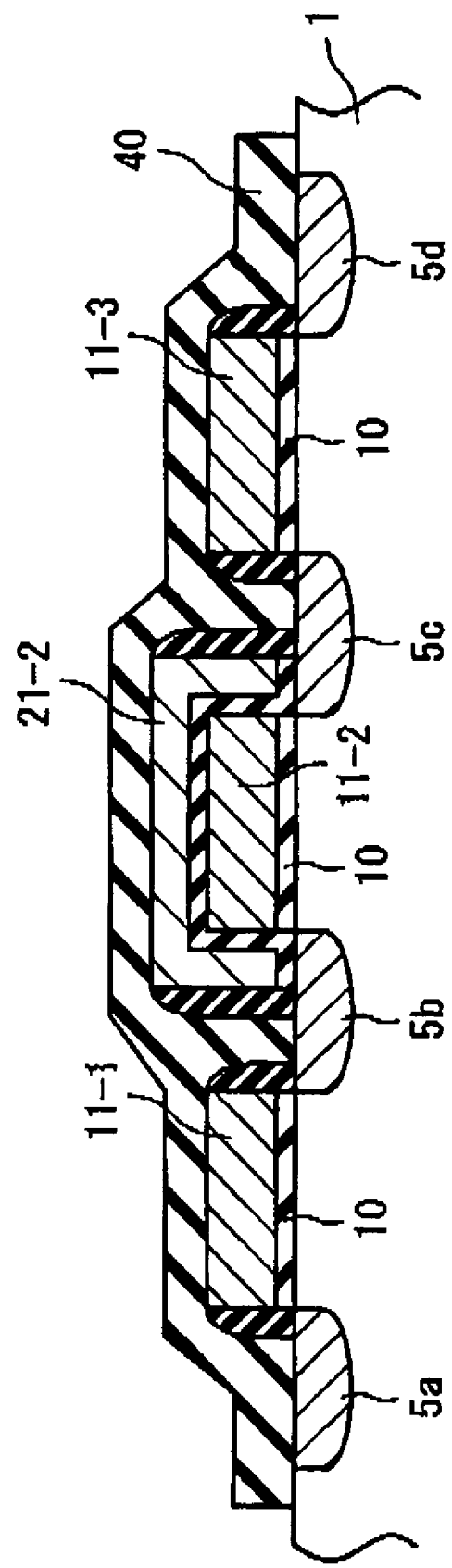

This is followed by forming a block oxide film 40 (for example, the silicon oxide film) on the entire structure by a CVD method and the like, as shown in FIG. 9H. Further, as shown in FIG. 9I, a resist mask 42 which partially covers the gate electrodes 11 of the respective transistors is formed. The resist mask 42 preferably has a uniform pattern. The block oxide film 40 is selectively etched by using the resist mask 42. As a result, a block oxide film 40-1 is formed at the center of the gate electrode 11-1, a block oxide film 40-2 is formed at the center of the resistive interconnection 21-2, and a block oxide film 43 is formed at the center of the gate electrode 11-3.

Figure 9J:
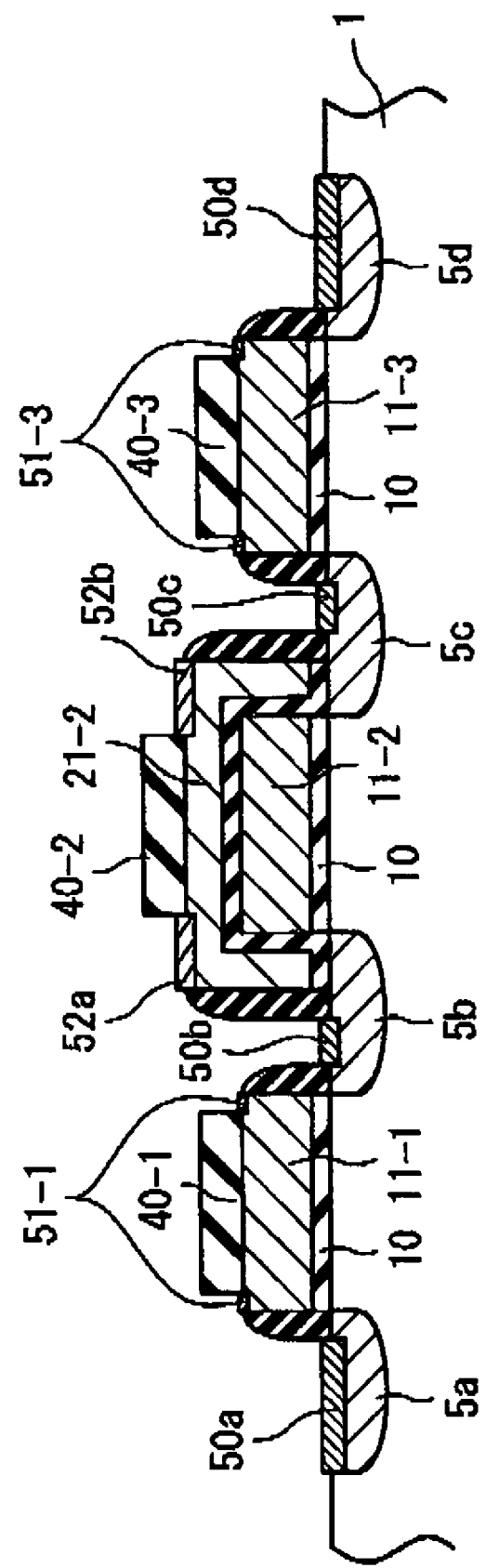

Next, a silicide processing is performed. For example, a heat treatment is performed after a deposition of a metal film (for example, a cobalt film) by a sputtering method. As a result, a silicide reaction occurs to form silicide films. The unreacted metal is then removed. In this example, as shown in FIG. 9J, the silicide films 50a to 50d are formed on the diffusion regions 5a to 5d, respectively. In addition, the silicide films 51-1 and 51-3 are formed on the gate electrodes 11-1 and 11-3, respectively. Moreover, the silicide films 52a and 52b are formed on the resistive interconnection 21-2. Due to the existence of the block oxide film 40-2, the silicide films 52a and 52b are formed at both edges of an upper surface of the resistive interconnection 21-2.

Next, as shown in FIG. 9K, an interlayer dielectric film 60 is deposited to cover the entire structure. After that, the upper surface of the interlayer dielectric film 60 is planarized by a CMP (Chemical Mechanical Polishing) technique.

Figure 9L:
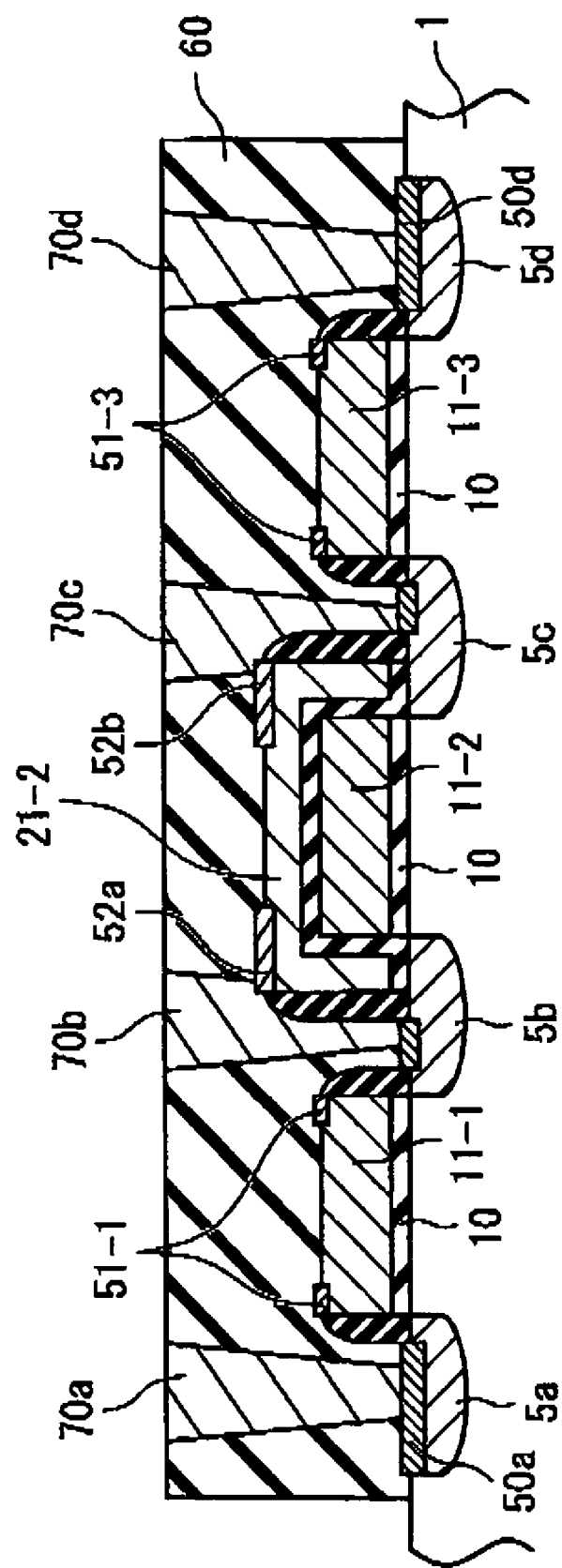

As shown in FIG. 9L, the contacts 70a to 70d are then formed through the interlayer dielectric film 60. The contacts 70a to 70d are provided to reach the silicide films 50a to 50d. In addition, the contact 70b is formed so as to be in contact with the silicide film 52a on the resistive interconnection 21-2. In the same manner, the contact 70c is formed so as to be in contact with the silicide film 52b on the resistive interconnection 21-2. As a result, the contact 70b and the contact 70c are electrically connected through the resistive interconnection 21-2.

Figure 9M:
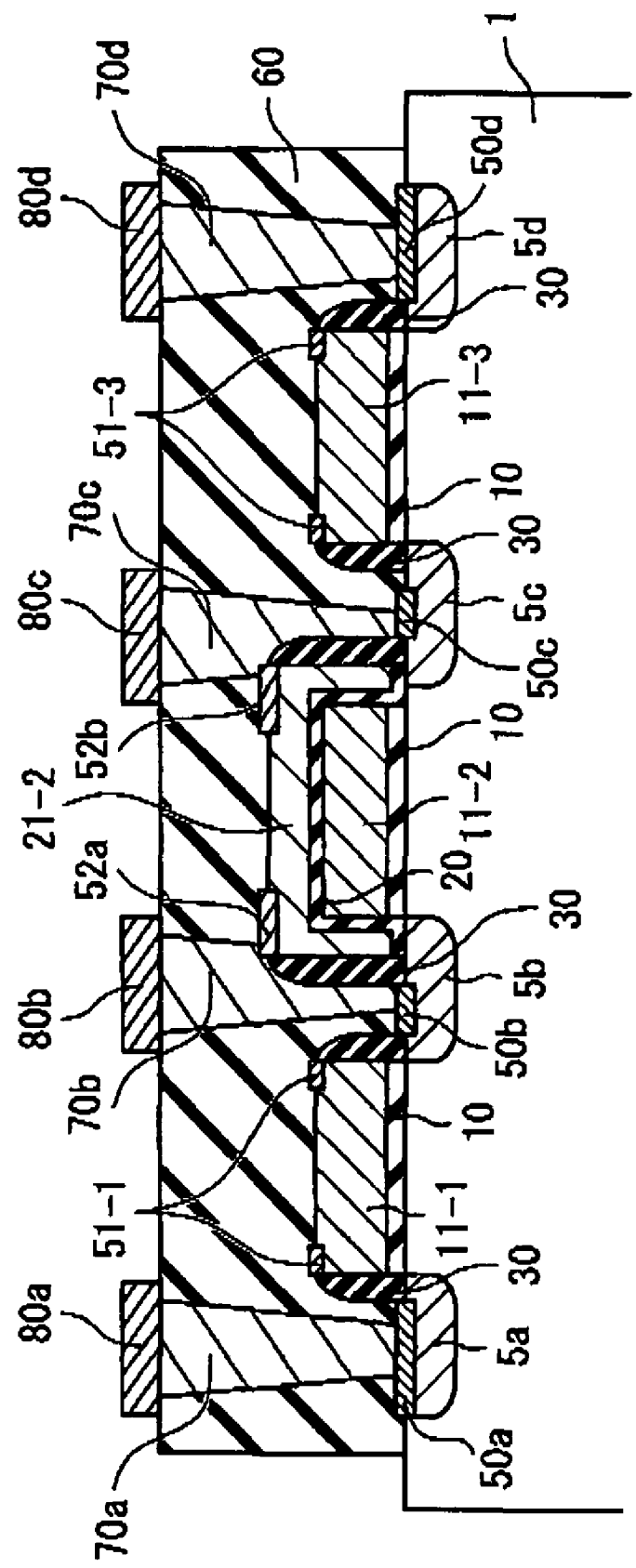

Finally, as shown in FIG. 9M, the metal interconnections 80a to 80d are formed in the metal interconnection layer on the interlayer dielectric film 60. As described above, the structure shown in FIG. 2 is obtained.

(Advantageous Features)

As discussed above, when the source and drain of the transistor within each memory cell are short-circuited by a metal interconnection, the influence of the non-selected cells is largely enhanced. As a result, the allowed range of the read current IR is extremely enlarged, and thus the condition shown in FIG. 8 is not satisfied. This implies that it is very difficult to store multi-value data onto each memory cell by using a metal interconnection.

In this embodiment, on the other hand, the multi-valued mask ROM is realized by using the resistive interconnection 21 formed of a gate material, and adjusting the resistance of the resistive interconnection 21 depending on the data to be programmed. The storage of multi-value data onto each memory cell effectively reduces the layout area of the mask ROM. The layout area reduction of the mask ROM allows reducing the area of a semiconductor chip which incorporates the mask ROM, and thereby reducing the manufacture cost.

Furthermore, data programming onto the mask ROM is achieved through only a single photolithography process for the resistance material film 23. As for a memory cell MC requiring no resistive interconnection, the resistance material film 23 is completely removed. As for other memory cells MC, the resistive interconnections (21-2, 21-5, and 21-6) are formed to have widths depending on the data to be programmed. As a result, a plurality of the resistive interconnections (21-2, 21-5, and 21-6) are formed with the resistances depending on the data to be programmed at the same time. As described above, the programming of multi-value data is realized in a single photolithography process. That is, the multi-valued mask ROM is manufactured with a reduced number of processes.

The mask ROM of this embodiment does not require controlling the impurity concentrations in the channel regions of the transistors TR. This eliminates the need for repeatedly performing the resist mask formation and the ion implantation the same number of times as the number of the allowed data values. As a result, the time and cost required for the manufacture are reduced. In addition, the mask ROM of this embodiment does not require increasing the spacing between adjacent transistors in order to prevent the resist mask from collapsing. This also contributes to the reduction of the layout area.

As explained above, the multi-valued mask ROM is realized by forming the resistive interconnections 21 of commonly-used gate material, such as a polysilicon film, an amorphous silicon film, and a silicon germanium film, in this embodiment. This effectively reduces the layout area of the mask ROM, and thereby reduces the manufacture time and cost. It should be noted that the manufacture of the multi-valued mask ROM may be realized by forming the resistive interconnections 21 of other materials with sheet resistance larger than a metal layer used as an interconnection layer, other than the gate material.

(Modified Embodiments)

In the above-described embodiments, the gate material film 13 is deposited to prepare the gate electrodes 11 and the resistance material film 23 is deposited to prepare the resistive interconnection 21. That is, two different material films are deposited. Such the process is similar to the manufacture process of the EEPROM (Electrically Erasable Programmable ROM) and the manufacture process of devices which incorporates resistive elements, such as the polysilicon resistors. Accordingly, in a manufacture process of a semiconductor device in which a mask ROM 100 and an EEPROM are monolithically integrated within one semiconductor chip, for example, the mask ROM 100 and the EEPROM can be simultaneously manufactured in the same manufacture process without requiring unpreferable additional processes.

Figure 11:
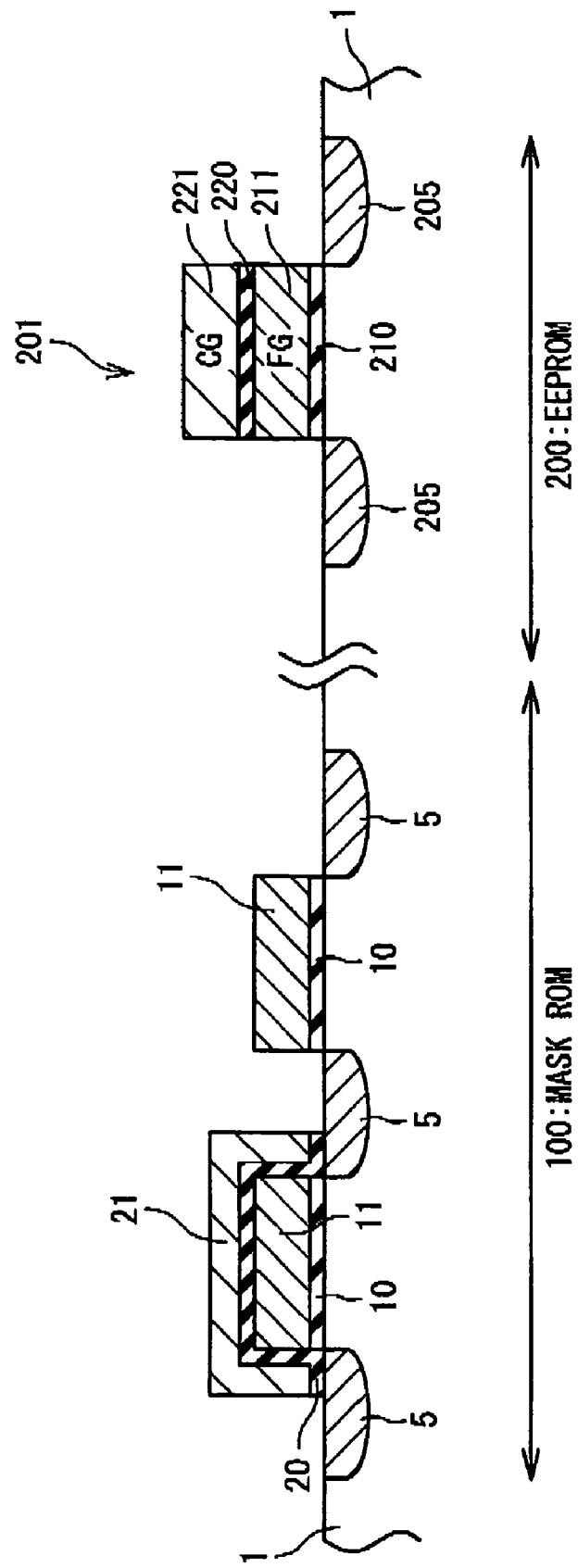
FIG. 11 is a sectional view showing a structure of a semiconductor device in an alternative embodiment of the present invention.

FIG. 11 is a sectional view showing an exemplary structure of a semiconductor device in which a mask ROM 100 and an EEPROM 200 are monolithically integrated. The mask ROM 100 has the same structure as that of the above-described embodiments.

The EEPROM 200 includes memory cell transistors 201 (one shown) integrated in the surface portion the semiconductor substrate 1. The memory cell transistors 201 each include diffusion regions 205 which are used as a source and drain, a first gate dielectric film 210, a floating gate 211, a second gate dielectric film 220, and a control gate 221. The floating gate 211 is formed to be opposed to the semiconductor substrate 1 across the first gate dielectric film 210. The control gate 221 is formed to be opposed to the floating gate 211 across the second insulation film 220.

The first gate dielectric film 10 of the mask ROM 100 is formed in the same process as the first gate dielectric film 210 of the EEPROM 200. In addition, the gate electrode 11 of the mask ROM 100 is formed in the same process as the floating gate 211 of the EEPROM 200. As a result, the gate electrode 11 and the floating gate 211 are formed in the same layer.

In addition, the second gate dielectric film 20 of the mask ROM 100 is formed in the same process as the second gate dielectric film 220 of the EEPROM 200. In addition, the resistive interconnection 21 of the mask ROM 100 is formed in the same process as the control gate 221 of the EEPROM 200. As a result, the resistive interconnection 21 and the control gate 221 are formed in the same layer. As described above, this preferably allows simultaneously forming the mask ROM 100 and the EEPROM 200 in a common process.

Although specific embodiments of the present invention are described above, those skilled in the art would appreciate that the present invention is not limited to the above embodiments, but may be modified and changed without departing from the scope of the invention.

Figure 12:
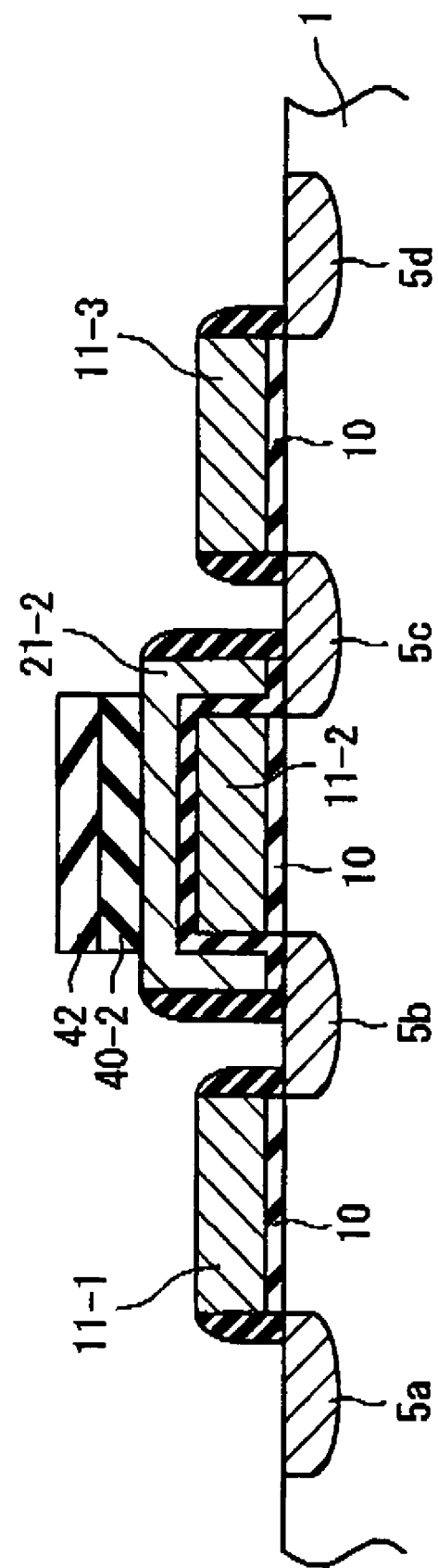
FIG. 12 is a sectional view showing an exemplary manufacture process in an alternative embodiment of the present invention.

For example, the manufacture process of the mask ROM may be variously modified. FIG. 12 is a sectional view showing another exemplary manufacture process of the mask ROM of the present invention, which is related to the process step shown in FIG. 9I. In FIG. 12, a resist mask 42 is formed so as to cover only the resistive interconnection 21, not covering the gate electrodes 11-1 and 11-3. The block oxide film 40 is selectively etched by using the resist mask 42. As a result, a block oxide film 40-2 is formed at the center of the resistive interconnection 21-2. This is followed by performing a silicide process, resulting in that the silicide films 51-1 and 51-3 are formed so as to fully cover the upper surfaces of the gate electrodes 11-1 and 11-3, respectively. Such process is preferable from a viewpoint of a device property since areas in which the silicide films 51-1 and 51-3 are formed are expanded, although the resist mask 42 is required to be formed on the basis of the data to be programmed onto the mask ROM.

What is claimed is:
1. A mask ROM comprising:
a plurality of memory cells each including:
first and second nodes; and
a transistor including a source and drain connected to said first and second nodes, respectively,
wherein a first memory cell out of said plurality of memory cells further includes a first resistive interconnection which provides an electrical connection between said first and second nodes, wherein a resistance of said first resistive interconnection is adjusted depending on data stored onto said first memory cell,
wherein a second memory cell out of said plurality of memory cells further includes a second resistive interconnection which provides an electrical connection between said first and second nodes of said second memory cell, and
wherein said resistance of said first resistive interconnection is different from a resistance of said second resistive interconnection.

2. The mask ROM according to claim 1, wherein material of said first resistive interconnection is same as that of a gate electrode of said first memory cell.

3. The mask ROM according to claim 2, wherein said first resistive interconnection is formed of material selected from a group consisting of polysilicon, amorphous silicon, and silicon germanium.

4. The mask ROM according to claim 1, wherein a width of said first resistive interconnection is different from a width of said second resistive interconnection.

5. The mask ROM according to claim 1, wherein said first resistive interconnection is formed between a gate layer in which a gate electrode of said transistor is formed and a metal interconnection layer in which a metal interconnection is formed.

6. The mask ROM according to claim 1, wherein said mask ROM and an EEPROM are monolithically integrated within a single semiconductor chip, said EEPROM including a control gate and a floating gate,
wherein said control gate is formed to be opposed to said floating gate across a dielectric film,
wherein a gate electrode of said transistor is formed in a same layer as said floating gate, and
wherein said first resistive interconnection is formed in a same layer as said control gate.

7. The mask ROM according to claim 1, wherein, when data stored in a selected memory cell out of said plurality of memory cells are read, said transistor of said selected memory cell is turned off.

8. The mask ROM according to claim 1, wherein said plurality of memory cells are arranged to form a NAND type mask ROM.

9. The mask ROM according to claim 8, wherein when data stored in a selected memory cell out of said plurality of memory cells is read, said transistor of said selected memory cell is turned off and said transistors of remaining memory cells out of said plurality of memory cells are turned on.

10. The mask ROM according to claim 1, wherein the first resistive interconnection comprises a structure in a NAND type cell and is connected to the first and second nodes in parallel with the transistor.

11. The mask ROM according to claim 1, wherein a thickness of the first resistive interconnection is substantially same as a thickness of the second resistive interconnection, where the first resistive interconnection and the second resistive interconnections are formed concurrently.

12. The mask ROM according to claim 1, wherein a third memory cell of the plurality of memory cells further includes a third resistive interconnection which provides an electrical connection between said first and second nodes of said third memory cell, and
wherein said resistance of said first resistive interconnection and said resistance of said second resistive interconnection is different from a resistance of said third resistive interconnection.

13. A mask ROM comprising:
a plurality of memory cells each including:
   first and second nodes; and
   a transistor including a source and drain connected to said first and second nodes, respectively,
wherein a first memory cell out of said plurality of memory cells further includes a first resistive interconnection which provides an electrical connection between said first and second nodes,
wherein a resistance of said first resistive interconnection is adjusted depending on data stored onto said first memory cell, and
wherein a width of the first resistive interconnection is less than a width of the transistor.

* * * * *